(12) United States Patent
Cao et al.

(10) Patent No.: US 8,544,969 B2
(45) Date of Patent: Oct. 1, 2013

(54) CHASSIS

(75) Inventors: Zhen-Cai Cao, Shenzhen (CN); Zhi-Xin Li, Shenzhen (CN); Jun-Xiong Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 331 days.

(21) Appl. No.: 13/037,416

(22) Filed: Mar. 1, 2011

(65) Prior Publication Data

US 2012/0161593 A1   Jun. 28, 2012

(30) Foreign Application Priority Data

Dec. 28, 2010   (CN) .......................... 2010 1 0609754

(51) Int. Cl.
    *A47B 91/00*   (2006.01)
(52) U.S. Cl.
    USPC .................. 312/351.1; 312/223.2; 248/188.4; 248/188.8
(58) Field of Classification Search
    USPC ........ 312/223.1, 223.2, 351.1, 351.3, 351.12; 248/615, 677, 188.2, 188.3, 188.4, 188.8; 361/679.59
    See application file for complete search history.

(56) References Cited

U.S. PATENT DOCUMENTS

| | | | | |
|---|---|---|---|---|
| 4,798,359 | A * | 1/1989 | Ball | 248/188.3 |
| 4,949,923 | A * | 8/1990 | Daily | 248/188.3 |
| 4,991,805 | A * | 2/1991 | Solak et al. | 248/188.4 |
| 5,332,182 | A * | 7/1994 | Weisz et al. | 248/188.4 |
| 5,688,030 | A * | 11/1997 | McAnally et al. | 312/223.2 |
| 7,588,218 | B2 * | 9/2009 | Kim | 248/188.4 |
| 2005/0285486 | A1 | 12/2005 | Xu | |
| 2008/0029664 | A1 * | 2/2008 | Hsu | 248/188.8 |
| 2009/0122280 | A1 * | 5/2009 | Kuroda | 353/119 |
| 2009/0160301 | A1 * | 6/2009 | Facis et al. | 312/351.1 |

FOREIGN PATENT DOCUMENTS

| | | |
|---|---|---|
| CN | 201181437 Y | 1/2009 |
| TW | M260765 | 4/2005 |

* cited by examiner

*Primary Examiner* — James O Hansen
(74) *Attorney, Agent, or Firm* — Altis & Wispro Law Group, Inc.

(57) ABSTRACT

A chassis includes a base board and a number of footpads mounted on a bottom of the base board. The base board defines a number of depressed portions corresponding to the footpads. Each footpad includes a fixing member mounted on an inner side of the base board and aligning with a corresponding depressed portion, a receiving member received in and rotatably mounted on a corresponding depressed portion of the base board, and a movable member received in and rotatably mounted on the receiving member. The movable member is rotatable in a first direction relative to the receiving member to extend out from the receiving member, and in a second direction opposite to the first direction relative to the receiving member to withdraw back into the receiving member.

15 Claims, 7 Drawing Sheets

CHASSIS

BACKGROUND

1. Technical Field

The present disclosure relates to a server chassis.

2. Description of Related Art

Server chassis can comprise tower or rack form factors. The tower chassis commonly requires support by only footpads, while the rack chassis requires none. However, in many cases, footpads are difficult to disengage from the chassis; and as a result, the tower chassis may not convert to a rack form factor, which is inconvenient.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
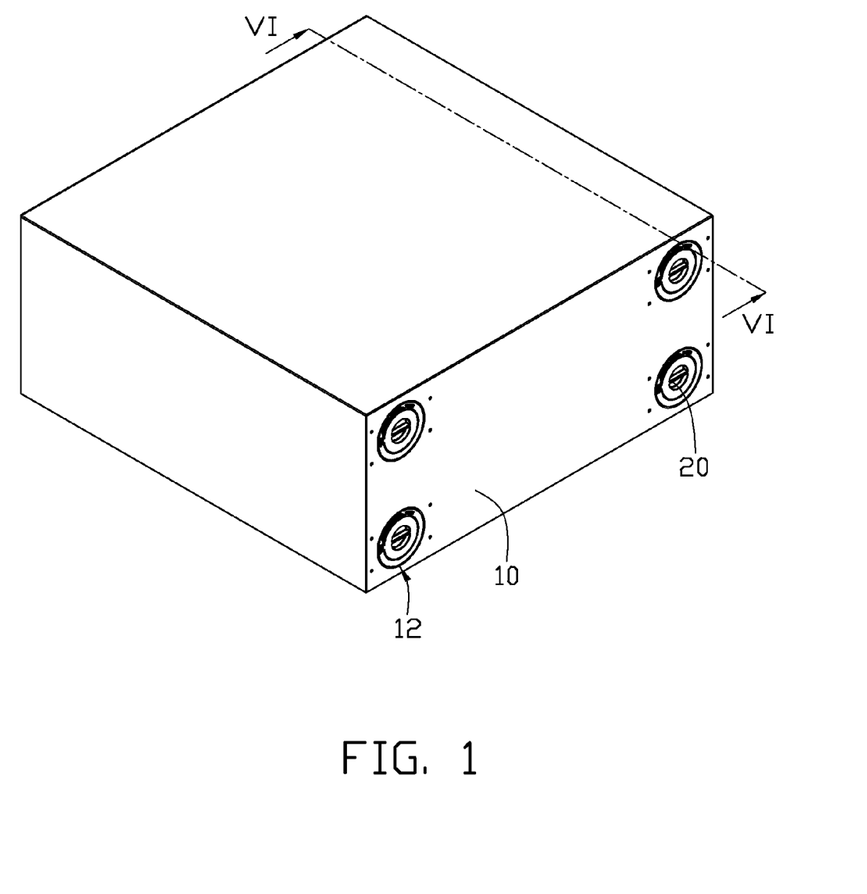
FIG. 1 is an assembled, isometric view of an exemplary embodiment of a chassis; the chassis including a plurality of footpads.
Figure 2:
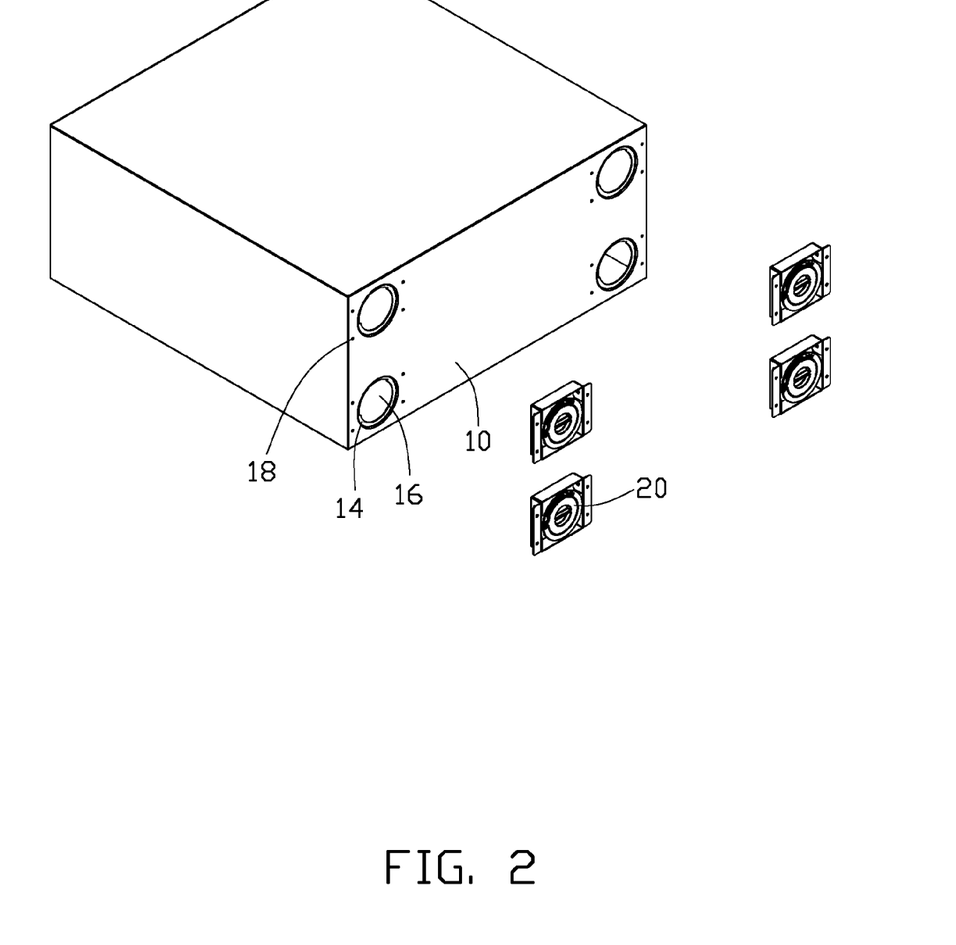
FIG. 2 is an exploded, isometric view of the chassis of FIG. 1.

Referring to FIGS. 1 and 2, an exemplary embodiment of a chassis includes a baseboard 10 and a plurality of footpads 20 mounted on the baseboard 10.

The baseboard 10 forms a plurality of fixing portions 12. Each fixing portion 12 includes a depressed portion 14 defined in a center of the fixing portion 12, and a plurality of fixing holes 18 defined in the baseboard 10 around the depressed portion 14. A through hole 16 is defined in a bottom of each depressed portion 14.

Figure 3:
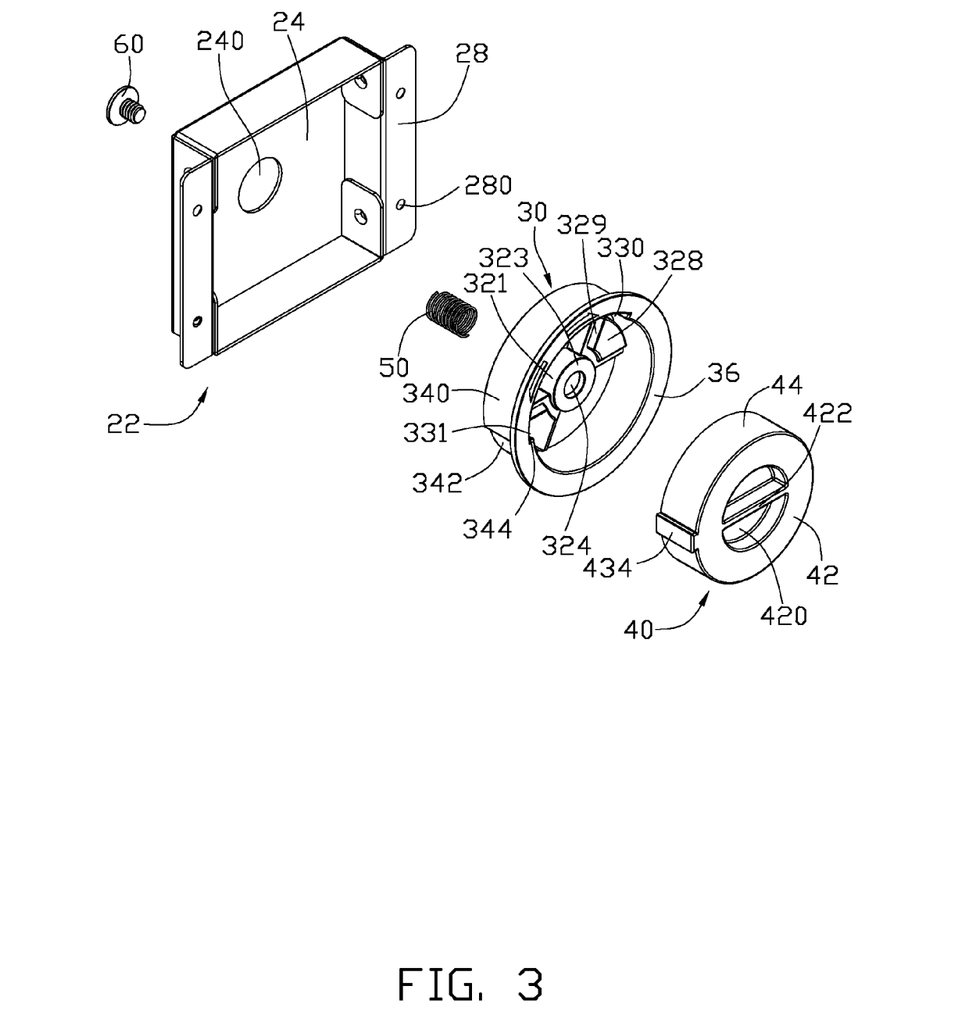
FIG. 3 is an exploded, isometric view of one of the plurality of footpads of FIG. 1.
Figure 5:
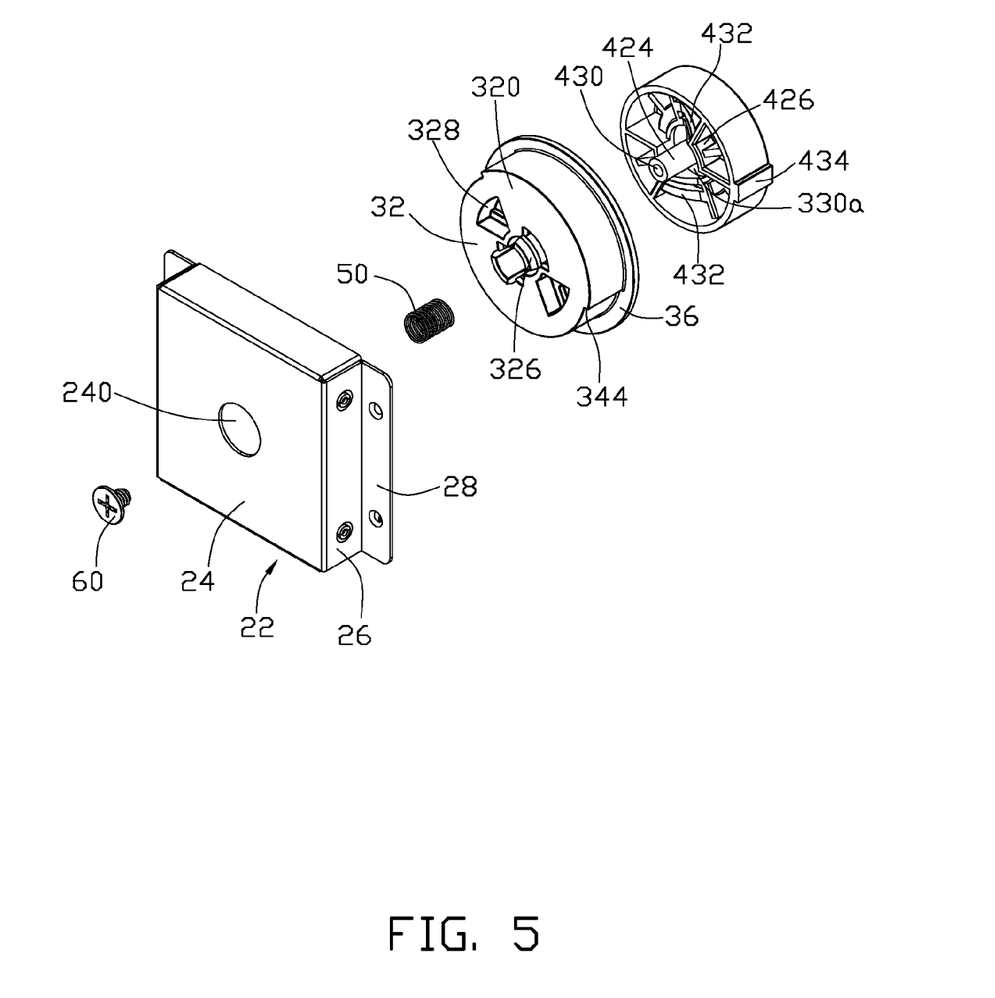
FIG. 5 is an exploded, isometric view of FIG. 4.

Referring to FIGS. 3 and 5, each footpad 20 includes a fixing member 22, a receiving member 30, a movable member 40, and a spring 50.

The fixing member 22 includes a rectangular top board 24 and four side boards 26 perpendicularly extending from four sides of the top board 24. A through hole 240 is defined in a center of the top board 24. Two fixing plates 28 extend away from each other from distal ends of two opposite side boards 26 of the fixing member 22. Two spaced fixing holes 280 are defined in each fixing plate 28.

The receiving member 30 includes a substantially circular top plate 32, a curved extension portion 320 extending from a part of a circumference of the top plate 32 and coplanar with the top plate 32, a first sidewall 342 extending from the other part of the circumference of the top plate 32, and a second sidewall 340 extending from a circumference of the extension portion 320. Two connection portions 344 are connected between corresponding ends of the first sidewall 342 and the second sidewall 340. A slide slot 331 is bound by inner surfaces of the connection portions 344 and the second sidewall 340. A blocking portion 36 extends from sides of the first and second sidewalls 342 and 340 opposite and parallel to the top plate 32. A first post 321 extends from a center of an inner surface of the top plate 32, and axially defines a through hole 324 extending through the top plate 32. An end wall 323 of the first post 321 opposite to the top plate 32 defines a through hole (not labeled), communicating with and smaller than the through hole 324 of the first post 321. Two latches 326 extend up from an outer surface of the top plate 32, at opposite sides of the through hole 324. Two substantially sector-shaped first protrusions 328 are formed in the inner surface of the top plate 32 at opposite sides of the first post 321. Each first protrusion 328 is located adjacent to a conjunction of corresponding ends of the first and second sidewalls 342 and 340. The first protrusion 328 includes two angled surfaces 329 at opposite sides of the first protrusion 328. A slot 330 is bounded by the first and second sidewalls 342 and 340, and each corresponding first protrusion 328.

The movable member 40 includes a substantially circular base plate 42 and a sidewall 44 extending from the circumference of the base plate 42. A blocking bar 434 perpendicular to the base plate 42 extends from an outer surface of the sidewall 44. The base plate 42 defines a circular depressed portion 420 in a center of an outer surface of the base plate 42, opposite to the receiving member 30. An operation bar 422 is connected between opposite sidewalls of the depressed portion 420, thereby dividing the depression portion into two semicircular parts. A second post 424 towards the top plate 32 of the receiving member 30 extends from a center of an inner surface of the base plate 42, and axially defines a threaded hole 430 therein. Two substantially sector-shaped second protrusions 426 protrude from the inner surface of the base plate 42, at opposite sides of the second post 424. An end of each second protrusion 426 away from the second post 424 is connected to the sidewall 44. A second slot 330a is defined between each second protrusion 426 and the post 424. Two substantially wedge-shaped projections 432 with angled tops are respectively connected between tops of the second protrusions 426 and the inner surface of the base plate 42, located at opposite sides of the second post 424.

Figure 4:
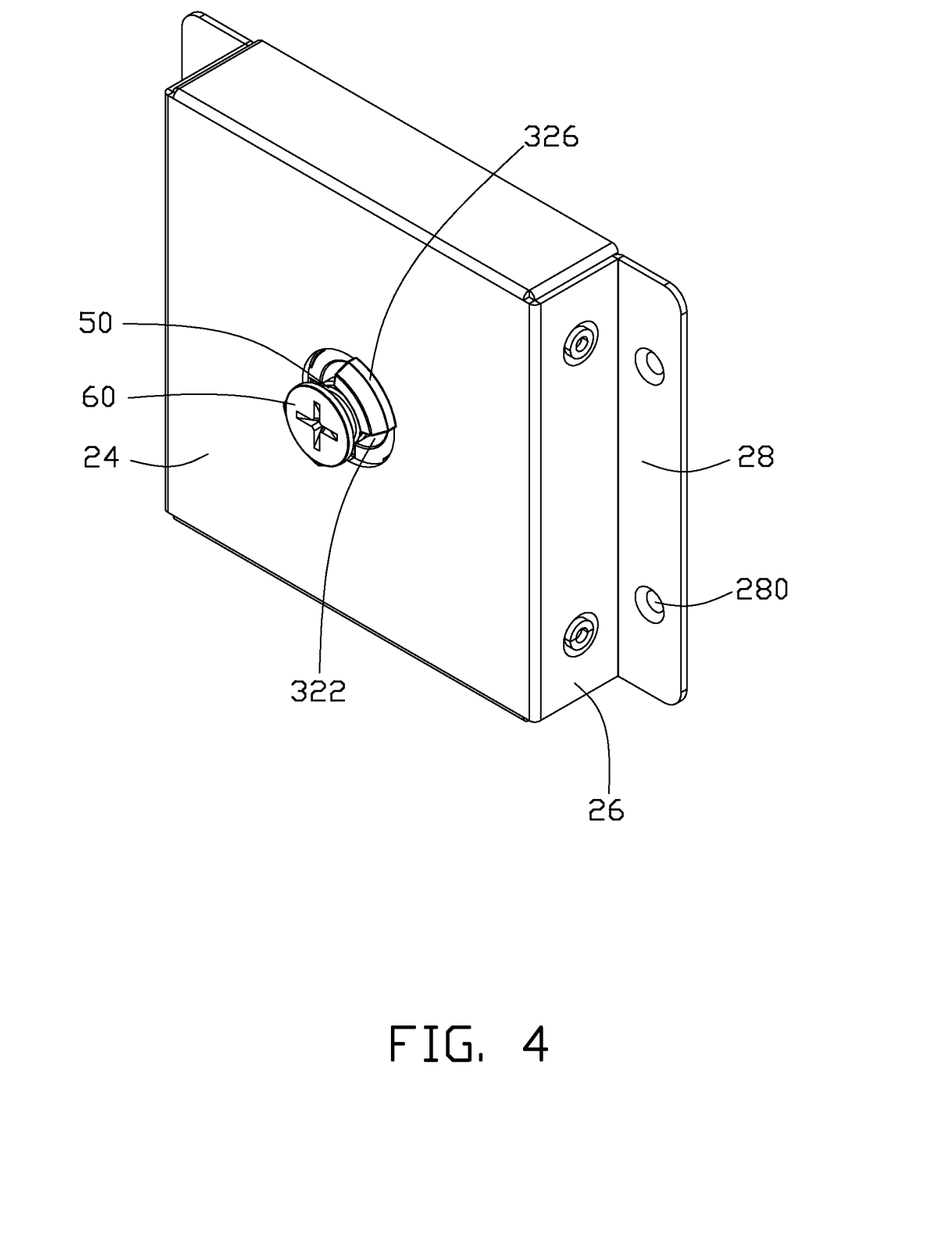
FIG. 4 is an assembled, isometric view of the footpad of FIG. 3, viewed from another perspective.
Figure 6:
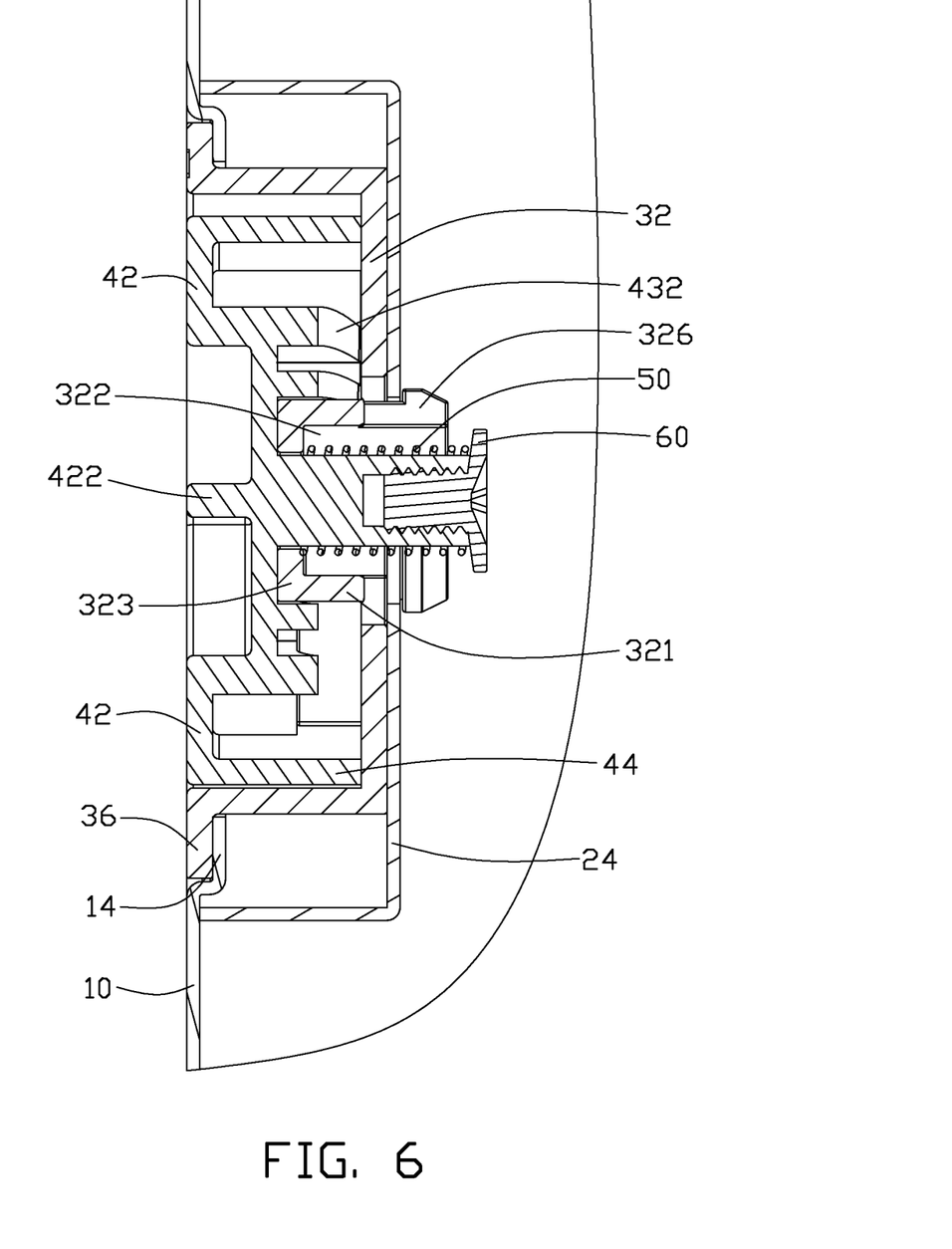
FIG. 6 is a sectional view taken along the line VI-VI of FIG. 1.

Referring to FIGS. 4 and 6, in assembly, the fixing plates 28 of the fixing member 22 are attached to the inner surface of the base board 10, with the fixing plates 28 contacting the inner surface of the base board 10 and located at opposite sides of a corresponding depressed portion 14. A plurality of screws (not shown) extends through the fixing holes 18 of the base board 10 and the fixing holes 280 of the fixing member 20, and is received in a plurality of threaded retainers (not shown), to mount the fixing member 20 to the inner side of the base board 10.

The second post 424 (see FIG. 5) of the movable member 40 extends through the through hole 324 from the end wall 323 of the receiving member 30, and the first post 321 is received in the second slots 330a between the second post 424 and the second protrusions 426 of the movable member 40. The blocking bar 434 of the movable member 40 is received in the slide slot 331 of the receiving member 30. At this time, the movable member 40 is completely received in the receiving member 30, with the first protrusions 328 of the receiving member 30 positioned at opposite sides of the second post 424 and the tops of the first protrusions 328 contacting the inner surface of the base plate 42. The distal end of the sidewall 44 of the movable member 40 is received in the first slots 330 of the receiving member 30. A fastener 60 extends through the spring 50 and is received in the threaded hole 430 of the second post 424, with opposite ends of the spring 50 resisting a head portion of the fastener 60 and the end wall 323 of the first post 321. Accordingly, the movable member 40 is pivotably mounted on the receiving member 30. The blocking bar 434 of the movable member 40 can selectively resists against one of the connection portions 344.

The receiving member 30 extends through the corresponding through hole 16 of the base board 10 and enters the corresponding fixing member 22, until the latches 326 and the head portion of the fastener 60 extend through the through hole 240 of the fixing member 22. Therefore, the latches 326 are blocked by the outer surface of the top board 24 of the fixing member 22 and the blocking portion 36 of the receiving member 30 is blocked by the bottom of the corresponding depressed portion 14. Thereby, the movable member 40 and the receiving member 30 are pivotably mounted on the fixing member 22.

Figure 7:
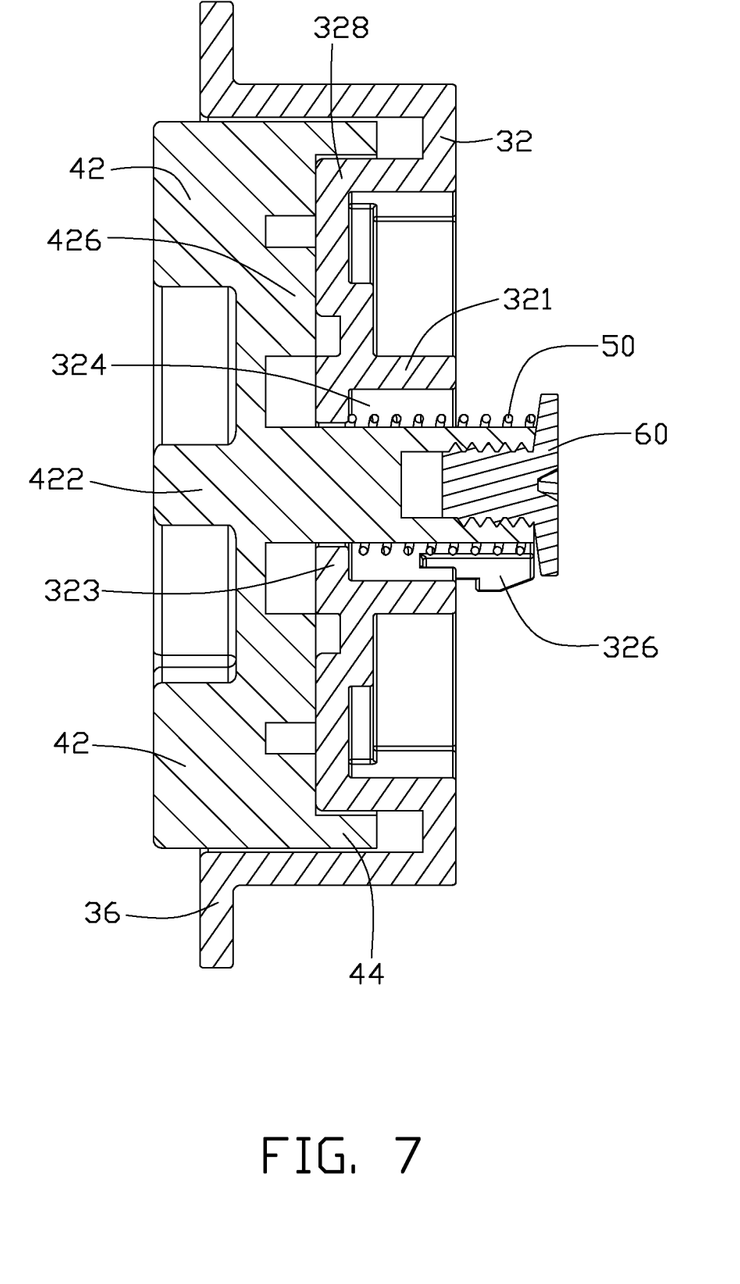
FIG. 7 is similar to FIG. 6, in another use state.

Referring to FIG. 7, in use, when the chassis is to be deployed in a tower chassis, the operation bar 422 is operated to move the blocking bar 434 toward the other connection portion 344, with the tops of the projections 432 of the movable member 40 sliding along the angled surfaces 329 of the corresponding first protrusions 328, and the second protrusions 426 contacting the tops of the corresponding first protrusions 328. Thereby, the movable member 40 extends out from the corresponding receiving member 30 to be supported under the base board 10. The blocking bar 434 of the movable member 40 is slid along the slide slot 331 until resisting a first connection portion 344 of the connection portions 344. At this time, the fastener 60 is moved toward the outer side of the base board 10, and the spring 50 is deformed to fix the movable member 40 in the receiving member 30 tightly.

When the chassis is to be deployed in a rack configuration, the operation bar 422 moves the blocking bar 434 reversely, the second protrusions 426 slide away from the corresponding first protrusions 328 and contact the inner surface of the top plate 32 of the receiving member 30. The projections 432 slide along the angled surfaces 329 of the corresponding protrusions 328, and the second protrusions 426 contact the inner surface of the top plate 32 of the receiving member 30. The blocking bar 434 of the movable member 40 is slid along the slide slot 331 until resisting a second connection portion 344 of the connection portions 344. Thereby, the movable member 40 withdraws back into the receiving member 30 completely, and the spring 50 is restored.

It is believed that the present embodiments and their advantages will be understood from the foregoing description, and they will be apparent that various changes may be made thereto without departing from the spirit and scope of the description or sacrificing all of their material advantages, the examples hereinbefore described merely being exemplary embodiment.

What is claimed is:

1. A chassis, comprising:
a base board defining a plurality of depressed portions; and
a plurality of footpads each comprising a fixing member mounted on an inner side of the base board and aligning with a corresponding depressed portion, a receiving member received in and rotatably mounted on a corresponding depressed portion of the base board, and a movable member received in and rotatably mounted on the receiving member;

wherein the movable member is rotatable in a first direction relative to the receiving member to extend out from the receiving member, and wherein the movable member is rotatable in a second direction opposite to the first direction relative to the receiving member to withdraw back into the receiving member; and wherein the receiving member comprises a top plate, two spaced first protrusions are formed on an inner surface of the top plate opposite to the base board, the movable member comprises a base plate, two spaced second protrusions are formed on an inner surface of the base plate facing the top plate of the receiving member, when the movable member is operated toward the first direction, the second protrusions are moved to contact tops of the first protrusions, when the movable member is operated to move toward the second direction, the second protrusions are moved to contact the inner surface of the top plate of the receiving member.

2. The chassis of claim 1, wherein a through hole is defined in a center of the depressed portion, the fixing member comprises a top board and two side boards extending from two opposite sides of the top board, two fixing plates extend from distal ends of the side boards away from each other to be fixed to an inner surface of the base board.

3. The chassis of claim 1, wherein a projection with a angled top is connected between a top of each second protrusion and the inner surface of the base plate, to engage with the corresponding first protrusion.

4. The chassis of claim 1, wherein the receiving member further comprises an extension portion extending from a part of the circumference of the top plate, a first sidewall extends from the other part of the circumference of the top plate, a second sidewall extends from a circumference of the extension portion, two connection portions are connected between corresponding ends of the first and second sidewalls, a third sidewall extends from a circumference of the base plate of the movable member, and a blocking bar extends from an outer surface of the third sidewall and locates between the connection portions.

5. The chassis of claim 4, wherein a blocking portion extends from sides of the first and second sidewalls of the receiving member opposite to the top plate, and is blocked by a bottom of the corresponding depressed portion.

6. The chassis of claim 4, wherein a first post extends from the inner surface of the top plate of the receiving member and axially defines a through hole, the first protrusions are positioned at opposite sides of the first post, a first slot is bounded by the first and second sidewalls, and each corresponding first protrusion, a second post extends from the inner surface of the base plate of the movable member, the second protrusions are positioned at opposite sides of the second post, a second slot is defined between each second protrusion and the second post, the second post extends through the through hole of the receiving member, and the first post is received in the second slots of the movable member, the third sidewall of the movable member is received in the first slots of the receiving member.

7. The chassis of claim 6, wherein the through hole of the first post extends through the top plate of the receiving member, two latches extend from the outer surface of the top plate at opposite sides of the through hole, the latches extend through the base board to be blocked by the inner surface of the top board of the fixing member to fix the receiving member to the fixing member.

8. The chassis of claim 6, wherein the second post axially defines a threaded hole, each footpad further comprises a resilient member and a fastener, the resilient member is received in the through hole of the first post, the fastener extends through the resilient member and is received in the thread hole to rotatably fix the movable member to the receiving member.

9. The chassis of claim 8, wherein opposite ends of the resilient member resist against the head portion of the fastener and an end wall of the first post opposite to the top plate of the receiving member.

10. A chassis, comprising:
a base board defining a depressed portion in a bottom of the base board; and
a footpad comprising a receiving member received in the depressed portion and rotatably mounted on the base board, and a movable member received in and rotatably mounted on the receiving member;
wherein the movable member is rotatable in a first direction relative to the receiving member to extend out from the receiving member, and wherein the movable member is rotatable in a second direction opposite to the first direction relative to the receiving member to withdraw back into the receiving member; and
wherein the receiving member comprises a top plate, two spaced first protrusions are formed on a bottom of the top plate opposite to the base board, the movable member comprises a base plate, two spaced second protrusions are formed on a top of the base plate facing the top plate of the receiving member, when the movable member is operated toward the first direction, the second protrusions are moved to contact tops of the first protrusions, and when the movable member is operated to move toward the second direction, the second protrusions are moved to contact the bottom of the top plate of the receiving member.

11. The chassis of claim 10, wherein a projection with a angled top is connected between a top of each second protrusion and the top of the base plate, to engage with the corresponding first protrusion.

12. The chassis of claim 10, wherein the receiving member further comprises an extension portion extending from a part of the circumference of the top plate, a first sidewall extends down from the other part of the circumference of the top plate, a second sidewall extends from a circumference of the extension portion, two connection portions are connected between corresponding ends of the first and second sidewalls, a third sidewall extends up from a circumference of the base plate of the movable member, a blocking bar extends from an outer surface of the third sidewall and locates between the connection portions.

13. The chassis of claim 12, wherein a first post extends down from the bottom of the top plate of the receiving member and axially defines a through hole, the first protrusions are positioned at opposite sides of the first post, a first slot is bounded by the first and second sidewalls, and each corresponding first protrusion, a second post extends up from the top of the base plate of the movable member, the second protrusions are positioned at opposite sides of the second post, a second slot is defined between each second protrusion and the second post, the second post extends through the through hole of the first post of the receiving member, and the first post is received in the second slots of the movable member, the third sidewall of the movable member is received in the first slots of the receiving member.

14. The chassis of claim 13, wherein the second post axially defines a threaded hole, the footpad further comprises a resilient member and a fastener, the resilient member is received in the through hole of the first post, the fastener extends through the resilient member and is received in the threaded hole to rotatably fix the movable member to the receiving member.

15. The chassis of claim 14, wherein opposite ends of the resilient member resist against the head portion of the fastener and an end wall of the first post opposite to the top plate of the receiving member.

* * * * *